United States Patent [19]

Tamiya

[11] Patent Number: 5,659,486

[45] Date of Patent: Aug. 19, 1997

[54] NETWORK ANALYZING METHOD

[75] Inventor: Yutaka Tamiya, Kawasaki, Japan

[73] Assignee: Fujitsu Limited, Kawasaki, Japan

[21] Appl. No.: 694,184

[22] Filed: Aug. 8, 1996

Related U.S. Application Data

[63] Continuation of Ser. No. 226,868, Apr. 13, 1994, abandoned.

[30] Foreign Application Priority Data

Apr. 19, 1993 [JP] Japan ................................. 5-091621

[51] Int. Cl.$^6$ .................................................. G06F 15/16
[52] U.S. Cl. ............... 395/200.75; 379/219; 340/286.02; 395/207
[58] Field of Search ................. 364/514 A, 514 B, 364/514 C, 514 R, 242.95, 242.96, 284.4, 940.92, 940.62, 940.64; 340/286.02; 379/219

[56] References Cited

U.S. PATENT DOCUMENTS

| | | | |
|---|---|---|---|
| 4,901,227 | 2/1990 | Soloway et al. | 364/900 |
| 4,991,176 | 2/1991 | Dahbura et al. | 371/27 |
| 5,197,127 | 3/1993 | Waclawsky et al. | 395/200 |
| 5,404,423 | 4/1995 | Uchiyama et al. | 395/22 |

OTHER PUBLICATIONS

Ramachandran et al., "Combined Topological & Functionality–Based Delay Estimation Using a Layout–Driven Approach for High Level Applications", Dec. 1994.

Tanenbaum, *Computer Networks*, 1981, pp. 62–67.

*Primary Examiner*—Emanuel T. Voeltz
*Assistant Examiner*—Patrick J. Assovad
*Attorney, Agent, or Firm*—Staas & Halsey

[57] ABSTRACT

A network analyzing method for analyzing an arrival time at each node of a network having at least one false path so as to perform a delay analysis and optimize the network, comprising the step of providing a plurality of arrival time variables, including an arrival time with respect to the false path and an arrival time without respect to the false path, for each node on the false path.

8 Claims, 11 Drawing Sheets

NETWORK ANALYZING METHOD

This application is a continuation of application Ser. No. 08/226,868, filed Apr. 13, 1994, now abandoned.

BACKGROUND OF THE INVENTION

1. Field of the Invention

The present invention relates to a network analyzing method for performing a delay analysis of a network having false paths and for optimizing the network.

There are many issues concerning networks that transmit information and goods. In particular, the issues of minimizing delays in a network or of restricting them to be as small as possible are important. Generally, there are two types of delays, one of which is an arrival time that is calculated from an input node of the network therethrough, the other of which is a required time that is calculated at an output node of the network.

An electric circuit is constructed of semiconductor devices that are connected by leads. Thus, when the semiconductor devices are treated as nodes, the electric circuit can be treated as a network.

A computer is constructed of functional elements that are connected by information transmission paths. When the functional elements are treated as nodes, the computer can be treated as a network.

A communication system is constructed of terminal units and exchanges that are connected with lines. When the terminal units and exchanges are treated as nodes, the communication system can be treated as a network.

A physical distribution system is constructed of collection and delivery stations that are connected by transportation paths such as roads. When the collection and delivery stations are treated as nodes, the physical distribution system can be treated as a network.

In the aforementioned networks, as delays in the networks are shortened, the values of information or goods transmitted are proportionally increased.

2. Description of the Prior Art

To analyze delays in a network having nodes a to q connected by arrow edges (directional lines), two methods are known.

In the first method, referring to FIG. 1, the arrival time at a node i (where i is a to q) is represented by $T(i)$. The input time of the node i is given by the following inequalities.

(a) i /∈ Inputs (in the case that the node i is not an input node of the network; where /∈ is the negation of ∈)

$$T(i) \geq \max\{T(j) + delay(j, i)\} j \in fanin(i)$$

(b) i ∈ Inputs (in the case that the node i is an input node of the network)

$$T(i) = Tstart(i)$$

(c) i ∈ Outputs (in the case that the node i is an output node of the network)

$$T(i) \leq Tend(i) \quad (1)$$

Inputs represents a set of input nodes of the network. Outputs represents a set of output nodes of the network. fanin(i) represents a set of nodes that supply inputs to node i. delay(j, i) represents a delay time from the node j to the node i. Initial time Tstart(i) is given to each input node. An allowable maximal arrival time Tend(i) is given to each output node.

For a required time $t(i)$, the similar relation is given by the following inequalities.

(1) (a)  i /∈ Outputs
$$t(i) \leq \min\{t(j) - delay(j, i)\}$$
$$j \in fanout(i)$$

(1) (b)  i ∈ Outputs
$$t(i) = Tend(i)$$

(1) (c)  i ∈ Inputs
$$t(i) \geq Tstart(i)$$

where fanout(i) represents a set of nodes that supply outputs of the node i.

Since the above formulas can be expressed with linear inequalities, such restrictions can be replaced with linear or non-linear programming problems, thereby optimizing various networks.

In the second method, a network shown in FIG. 2 is scanned from an input node to an output node so as to determine an arrival time T. An initial time is given to the input node (in this example, the initial time is 0). Iterate the following operation while there exists a node which is not given an arrival time: select a node whose all fanin nodes are already given an arrival time, then find the highest value of {(the arrival time of the fannin node)+(the delay time from the fanin node to this node)}, and give this node the highest value as its arrival time. This operation is equivalent to an expression where the sign of inequality of the formula (1) (a) is substituted with an equal sign. For example, the arrival time at the node d on the path connected to the node h (namely, 0+1=1) is compared with the arrival time at the node d on the path connected to the node c (namely, 2+1=3). Thus, the arrival time 3 is selected. To obtain a required time, an initial time is given to each output node. Thereafter, the network is scanned from the output side to the input side.

General networks may have false paths. The false paths should satisfy the following conditions.

(a) The false paths should be physically present as connections between nodes in the network.

(b) The false paths do not actually or substantially transmit information, goods, or the like from an input node to an output node of the paths as a network operation.

A typical example of a false path is a redundant path compared with a bypass. In the network shown in FIG. 2, when a path of a→b→c→d→e→f→g has a delay of 6, if the delay needs to be reduced, a node k as shown in FIG. 3 may be placed in the network so as to bypass the path of a→b→c→d→e→f→g with a path of a→k→g. In other words, since information travels the path of a→k→g earlier than the path of a→b→c→d→e→f→g, the latter path becomes a false path. However, a false path does not mean an unnecessary path. When one of the edges on the false path is removed, the path of h→g or the path of a→j is disconnected. Thus, by removing edges, false paths cannot be removed. The maximum delay path of the chart is apparently the path of a→b→c→d→e→f→g. However, in consideration of the network operation, the maximum delay path is a→k→g.

In large networks, such false paths sometimes occur due to bypasses that are placed intentionally by network designers. However, false paths may be mistakenly placed in a network designing process.

In the conventional delay analyzing method, a network is defined on a chart, so that a maximum path on the chart is obtained. Thus, in the conventional method, due to the presence of false paths, correct delays cannot be obtained. In addition, when false paths are removed, other paths may be removed. Thus, correct delays may not be obtained. Consequently, the conventional method cannot deal with networks having false paths.

SUMMARY OF THE INVENTION

An objective of this invention is to provide a network analyzing method for correctly evaluating delays of all paths in a network-having false paths so as to analyze the network.

A first aspect of the present invention is a network analyzing method for analyzing an arrival time at each node of a network having at least one false path so as to perform a delay analysis and optimize the network, comprising the step of giving a plurality of arrival time variables that are an arrival time with respect to the false path and an arrival time without respect to the false path to each node on the false path.

A second aspect of the present invention is a network analyzing method for analyzing a required time at each node of a network having at least one false path so as to perform a delay analysis and optimize the network, comprising the step of allocating a plurality of required time variables that are a required time with respect to the false path and a required time without respect to the false path to each node on the false path.

According to the present invention, since each node on a false path has an arrival time and a required time that are without respect to the false path and an arrival time and a required time that are with respect to the false path, restricting expressions of the arrival time and required time at each node can be precisely provided regardless of whether false paths are present or absent. Thus, the delay of any path can be evaluated.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
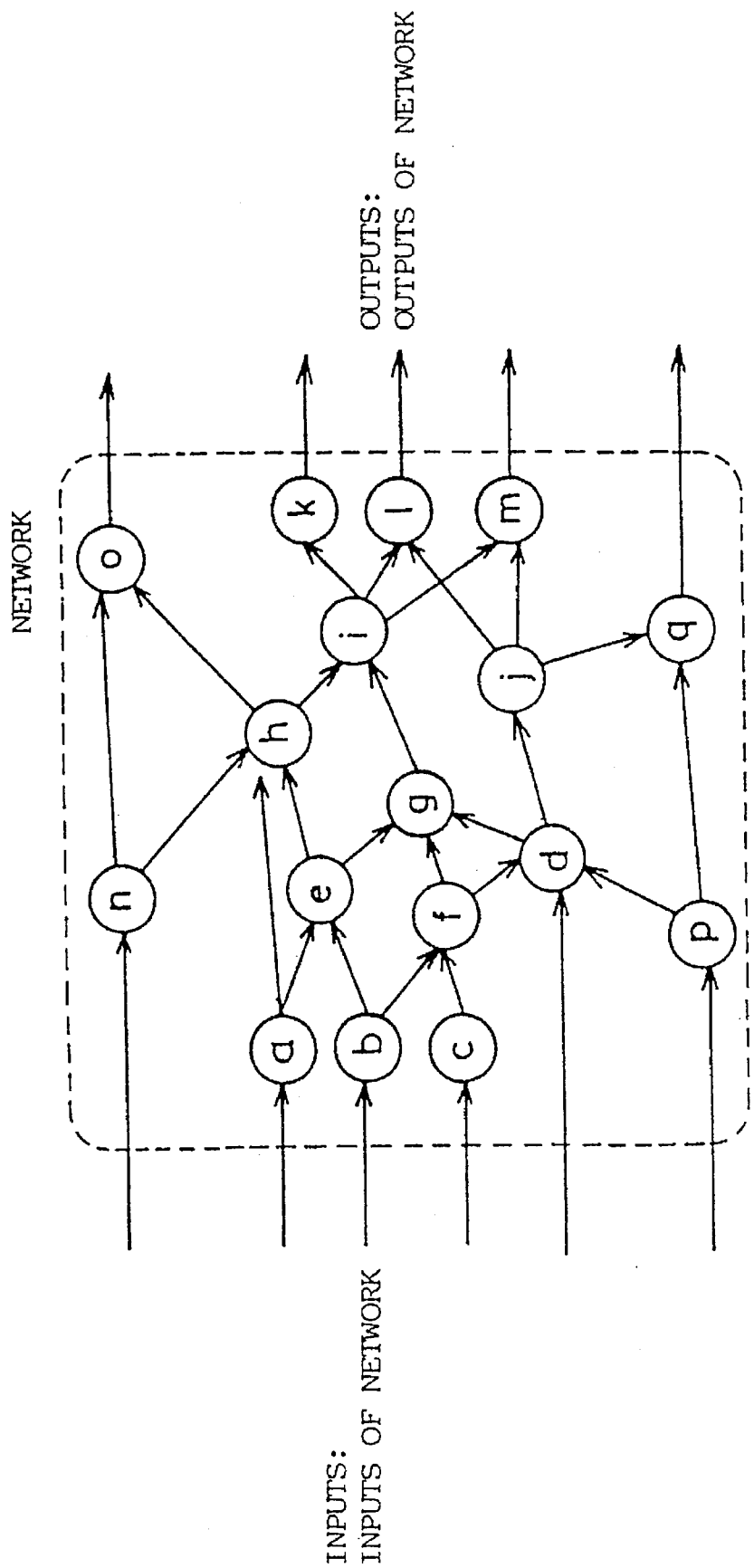
FIG. 1 is a schematic diagram for explaining a conventional network analysis.
Figure 2:
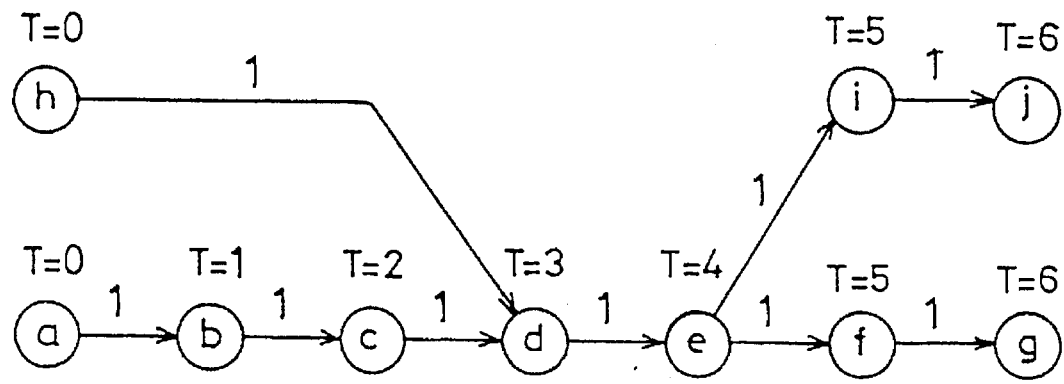
FIG. 2 is a schematic diagram for explaining a conventional network analysis.
Figure 3:
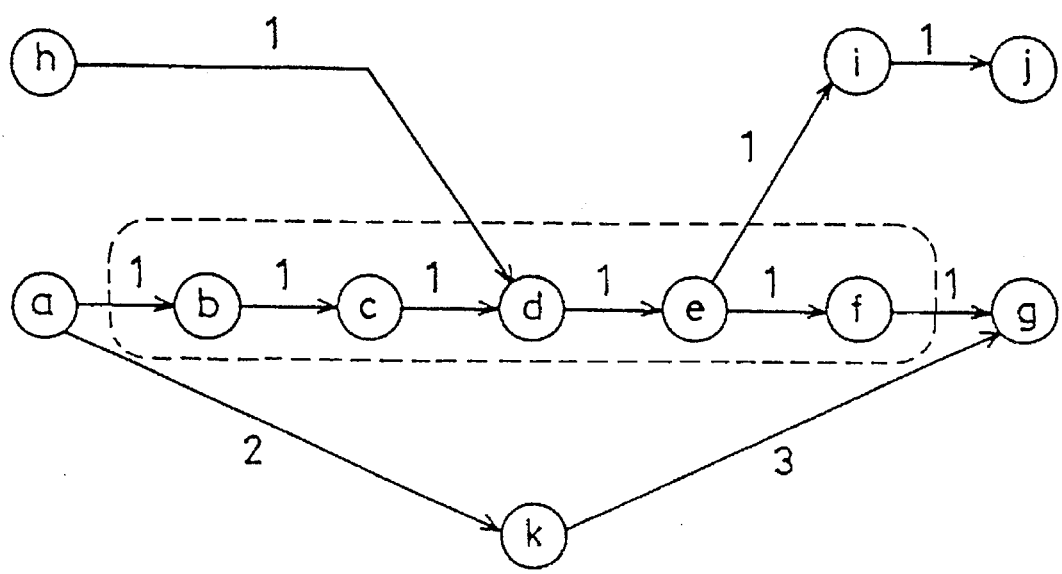
FIG. 3 is a schematic diagram for explaining a conventional network analysis.
Figure 4:
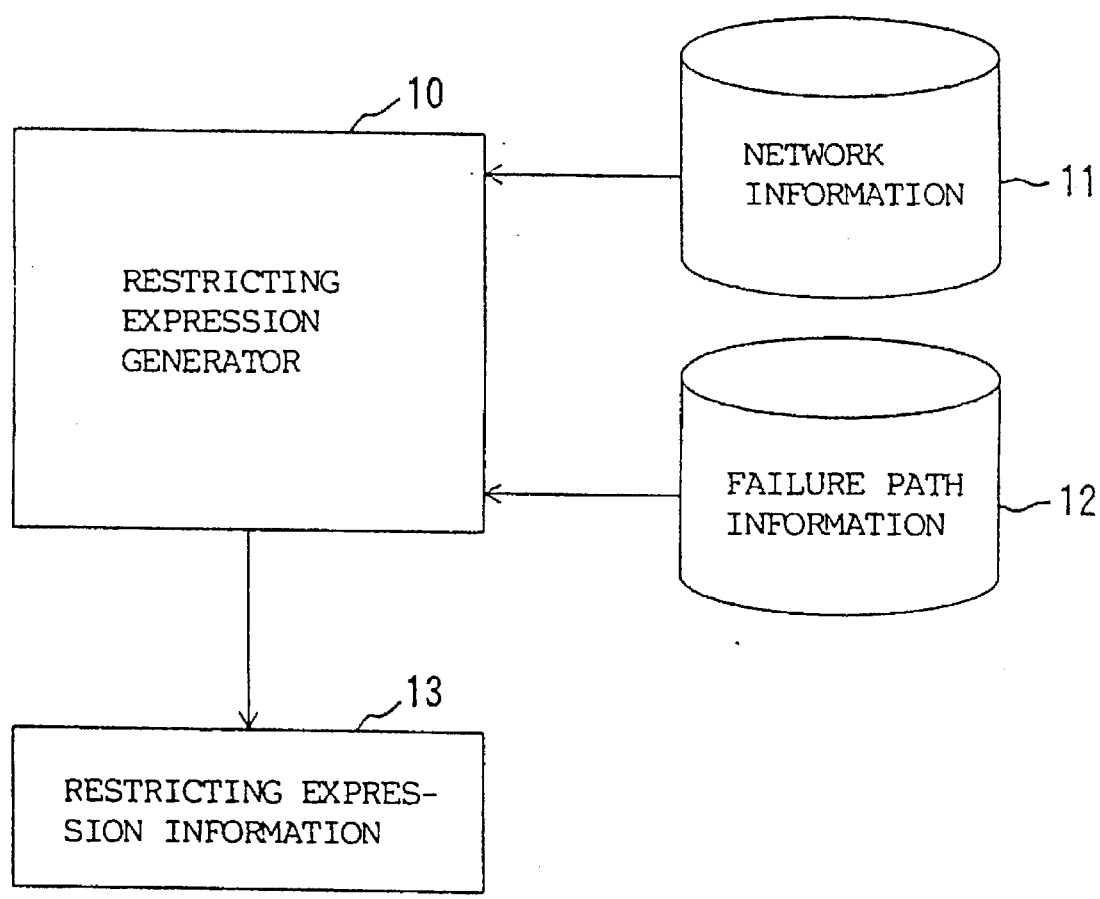
FIG. 4 is a block diagram showing a construction of a system according to the present invention.

FIG. 4 is a diagram showing a construction of a network having at least one false path according to the present invention. A false path discussed in the present invention are extended from a conventional concept and defined as a set of paths according to the following:

(a) A false path FP should be a set of failure paths that connect nodes of a network.

(b) A false path FP should have an input node group Start(FP) and an output node group End(FP) that are inputs and outputs of the network, respectively. All paths from the Start(FP) to the End(FP) should be ineffective.

Figure 5:
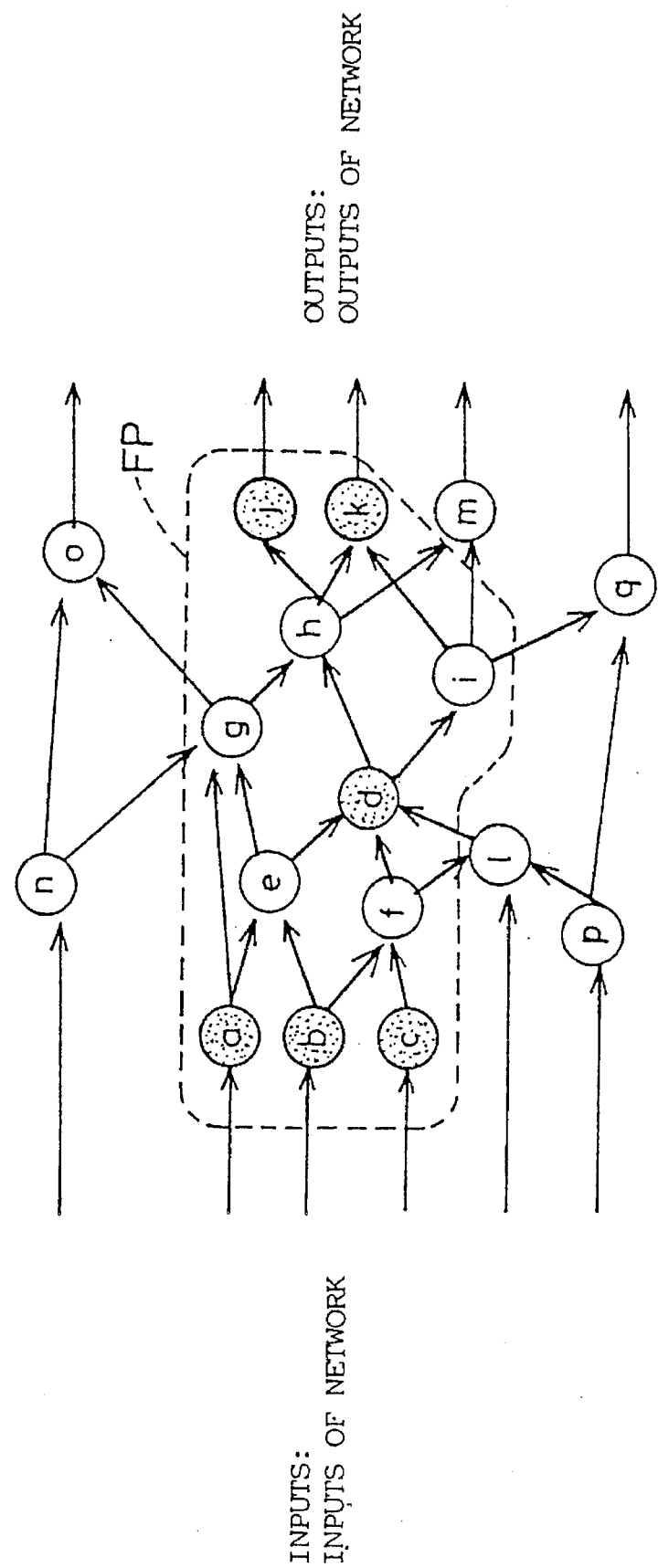
FIG. 5 is a schematic diagram showing a network having a false path FP.

In FIG. 5, FP={a, b, . . . , k}, Start(FP)={a, b, c, d}, and End(FP)={j, k}. Failure paths included in FP are (a→j), (a→k), (b→j), (b→k), (c→j), (c→k), (d→j), and (d→k). Delays that take place on these false paths are not considered. In addition, an input node {n} to FP excluding Start (FP) is present. Since paths from the input node {n} to End(FP) are not failure paths, their delays are considered. Likewise, at the output nodes {f, g, h, i} of FP not included in End(FP), delays from Start(FP) are considered. Moreover, delays of paths that partially pass nodes of false paths (for example, n→g→o and l→d→i→m) are considered.

All nodes included in the false path FP each have an arrival time T without respect to false paths, an arrival time tfalse with respect to false paths, a required time t without respect to false paths, and a required time Tfalse without respect to false paths.

The arrival time T and the required time t have the same definitions as an arrival time and a required time of any node that is not included in the false path FP in the network, respectively. Tfalse represents an arrival time of which inputs outside FP are ignored at the input node Start(FP) of the false path FP. When data or goods are output from the output node End(FP) of the false path FP to a node outside the false path FP, Tfalse is used instead of T.

tfalse represents a required time of which outputs outside the false path FP are ignored at the output node End(FP) of the false path FP. When data or goods are input from a node outside the false path FP to the input node Start(FP) of the false path FP, tfalse is used instead of t.

The aforementioned arrival time and required time are defined as follows. When the max operator is applied to the null set, the resulting value is defined as −∞. Likewise, when a set to be operated with an operator min is null, the value thereof is defined as +∞.

An arrival time T(i) and an arrival time Tfalse(i) are given by the following formulas (3) (a) to (3) (h).

(3) (a) i /∈ FP, i /∈ Inputs (in the case that the node i is included in neither FP nor Inputs, namely the nodes o, q, and m in FIG. 5)

$$T(i) \geq \max\{\max\{T(j) + delay(j, i)\}, \\ j \in fanin(i) \\ j /\in End(FP) \\ \max\{Tfalse(j) + delay(j, i)\}\} \\ j \in fanin(i) \\ j \in End(FP)$$

(3) (b) i ∈ FP−Start(FP), i /∈ Inputs (in the case that the node i is included in FP excluding Start(FP) and not included in Inputs, namely the nodes e, f, g, h, i, j, and k in FIG. 5)

$$T(i) \geq \max_{j \in \text{fanin}(i)} \{\max\{T(j) + \text{delay}(j, i)\}\}$$

$$Tfalse(i) \geq \max_{\substack{j \in \text{fanin}(i) \\ j \notin FP}} \{\max\{T(j) + \text{delay}(j, i)\},$$
$$\max_{\substack{j \in \text{fanin}(j) \\ j \in FP}} \{Tfalse(j) + \text{delay}(j, i)\}\}$$

(3) (c) i ∈ Start(FP), i ∉ Inputs (in the case that the node i is included in Start(FP) and not included in Inputs, namely the node d in FIG. 5)

$$T(i) \geq \max_{j \in \text{fanin}(i)} \{\max\{T(j) + \text{delay}(j, i)\}$$

$$Tfalse(i) \geq \max_{\substack{j \in \text{fanin}(i) \\ j \in FP}} \{Tfalse(j) + \text{delay}(j, i)\}$$

The following (3) (d), (3) (e), and (3) (f) give initial values.

(3) (d) i ∉ FP, i ∈ Inputs (in the case that the node i is not included in FP, but included in Inputs, namely the nodes l, n, and p in FIG. 5)

$$T(i) = T\text{start}(i)$$

(3) (e) i ∈ FP—Start(FP), i ∈ Inputs (in the case that the node i is included in FP excluding Start(FP), and included in Inputs, namely no nodes in FIG. 5)

$$T(i) = T\text{start}(i)$$

$$Tfalse(i) = T\text{start}(i)$$

(3) (f) i ∈ Start(FP), i ∈ Inputs (in the case that the node i is included in Start(FP) and included in Inputs, namely the nodes a, b, and c in FIG. 5)

$$T(i) = T\text{start}(i)$$

$$Tfalse(i) = -\infty$$

(3) (g) and (3)(h) are given as specifications of the network.

(3) (g) i ∉ End(FP), i ∈ Outputs (in the case that the node i is not included in End(FP), but is included in Outputs, namely the nodes o, p, and m in FIG. 5)

$$T(i) \leq T\text{end}(i)$$

(3) (h) i ∈ End(FP), i ∈ Outputs (in the case that the node i is included in End(FP) and included in Outputs, namely the nodes j and k in FIG. 5)

$$Tfalse(i) \leq T\text{end}(i)$$

The first element inside the braces of the right term of the formula (3) (a) represents the maximum value of (the arrival time T(j)+the delay time delay(j, i)) at the node j that supplies an input of the node i and that is not included in the output nodes End(FP) of the false path FP, whereas the second element thereof represents the maximum value of (the arrival time Tfalse(j)+the delay time delay(i, j)) at the node j that supplies an input of the node i and that is included in the output node End(FP) of the false path FP. The entire right term represents the maximum value of the first element and the second element.

A required time t(i) and a required time tfalse(i) are given by the following formulas (4) (a) to (4) (h).

(4)(a) i ∉ FP, i ∉ Outputs (in the case that the node i is included in neither FP nor Outputs, namely the nodes l, n, and p in FIG. 5)

$$t(i) \leq \min_{\substack{j \in \text{fanout}(i) \\ j \notin \text{Start}(FP)}} \{\min\{t(j) - \text{delay}(j, i)\},$$
$$\min_{\substack{j \in \text{fanout}(i) \\ j \notin \text{Start}(FP)}} \{tfalse(j) - \text{delay}(j, i)\}$$

(4) (b) i ∈ FP—End(FP), i ∉ Outputs (in the case that the node i is included in FP excluding End(FP), and not included in Outputs, namely the nodes a, b, c, d, e, f, g, h, and i in FIG. 5)

$$t(i) \leq \min_{j \in \text{fanout}(i)} \{t(j) - \text{delay}(i, j)\}$$

$$tfalse(i) 1 \leq \min_{\substack{j \in \text{fanout}(i) \\ j \notin FP}} \{\min\{t(j) - \text{delay}(i, j)\},$$
$$\min_{\substack{j \in \text{fanout}(i) \\ j \notin FP}} \{tfalse(j) - \text{delay}(i, j)\}\}$$

(4) (c) i ∈ End(FP), i ∉ Inputs (in the case that the node i is included in End(FP), but not included in Inputs, namely the nodes j and k in FIG. 5)

$$t(i) \leq \min_{j \in \text{fanout}(i)} \{t(j) - \text{delay}(i, j)\}$$

$$tfalse(i) \leq \min_{\substack{j \in \text{fanout}(i) \\ j \in FP}} \{tfalse(j) - \text{delay}(i, j)\}$$

The following (4) (d), (4) (e), and (4) (f) give initial values.

(4) (d) i ∉ FP, i ∈ Outputs (in the case that the node i is not included in FP, but included in Outputs, namely the nodes m, o, and q in FIG. 5)

$$t(i) = T\text{end}(i)$$

(4) (e) i ∈ FP—End(FP), i ∈ Outputs (in the case that the node i is included in FP excluding End(FP), and included in Outputs, namely no nodes in FIG. 5)

$$t(i) = T\text{end}(i)$$

$$tfalse(i) = t\text{end}(i)$$

(4) (f) i ∈ End(FP), i ∈ Outputs (in the case that the node i is included in End(FP), and included in Outputs, namely the nodes j and k in FIG. 5)

$$t(i) = T\text{end}(i)$$

$$tfalse(i) = +\infty$$

The following (4) (g) and (4) (h) are given as specifications of the network.

(4) (g) i ∉ Start(FP), i ∈ Inputs (in the case that the node i is not included in Start(FP), but is included in Inputs, namely the nodes l, n, and p in FIG. 5)

$$t(i) \geq T\text{start}(i)$$

(4) (h) i ∈ Start(FP), i ∈ Inputs (in the case that the node i is included in Start(FP), and included in Inputs, namely the nodes a, b, and c in FIG. 5)

$$\text{Tfalse}(i) \geq \text{Tstart}(i)$$

When the false path FP is present in the network, delays of the following five paths should be considered. The formula (3) represents that the delays of these paths can be correctly calculated.

(Path a) A path that enters into FP at an input node in Start(FP) and exits from FP at output node End ( FP )

(Path b) A path that enters into FP at input node Start(FP) and exits from FP at a node other than output node End(FP)

(Path c) A path that enters into FP at a node other than input node Start(FP) and exits from FP at output node End(FP)

(Path d) A path that enters into FP at a node other than input node Start(FP) and exits from FP at a node other than output node End(FP)

(Path e) A path that includes no nodes of FP

Delay can be ignored only in path a. T is an arrival time considering all input nodes on FP. Tfalse is an arrival time at Start(FP), ignoring all input nodes other than FP. All nodes on the path e are not on false paths. Thus, delay is given by the variable T. Thus, as with the conventional method, the delay analyzing method of the path e is irrespective of the presence of false paths.

With respect to the paths b and d, since they exit from FP at nodes other than End(FP), only the first element of the formula (3) (a) is valid. In other words, only T rather than Tfalse is transferred. Thus, the delay analysis for the paths b and d is performed irrespective of whether false paths are present or absent.

With respect to the path c, when it enters FP, delay is transferred to Tfalse because of the first element of the evaluation expression (second expression) of the formula (3) (b) for Tfalse. In FP, the delay is transferred by Tfalse because of the second element of the second expression of the formula (3) (b). When the path c exits from FP, the delay is transferred from Tfalse to T because of the second element of the formula (3) (a). Thus, the delay evaluation of this path can be correctly performed.

Since the path a passes through a false path, the delay should not be transferred. When the path a enters into FP, the delay is transferred because of the evaluation expression of T of the formula (3) (c). However, in the evaluation expression of Tfalse, since inputs outside FP are excluded, the delay is not transferred. Consequently, only T is an alternative that gives the delay. Inside FP, T transfers the delay. However, outside FP, only Tfalse instead of T is transferred because of the second element of the formula (3) (2). Thus, the delay of the path a is not transferred to the inside of FP. This result accords with the definition of the false paths.

The aforementioned discussion applies to the formula (4) with respect to arrival time.

All the restricting expressions as in the formulas (3) and (4) are linear inequalities. These linear inequalities can be easily applied to linear programming problems and non-linear programming problems. The number of variables newly introduced and the number of restricting expressions are proportional to at most the number of nodes included in the false paths. The level of complexity or difficulty of the delay analyzing method according to the present invention is nearly the same as that of the conventional delay analyzing method that does not consider false paths.

By employing the linear inequalities of the formulas (3) and (4), a variety of networks considering restrictions with respect to arrival time and required time can be optimized. By substituting the signs of inequalities of the formulas (3) (a) to (3) (d) with equal signs and by scanning the network from the input side to the output side, an arrival time at any output node of the network can be calculated. Likewise, by substituting the sign of inequalities of the formulas (4) (a) to (4) (d) with equal signs and by scanning the network from the output side to the input side, an arrival time at any input node of the network can be calculated.

FIG. 4 shows a construction of a system that generates linear inequalities according to the present invention. In this drawing, a storing portion 11 stores the construction (each node and each edge) of a network to be analyzed. In addition, the storing portion 11 stores network information representing input nodes and output nodes. A storing portion 12 stores false path (FP) information that represents nodes constructing the false path (FP) of the network, input nodes and output nodes of the false path (FP).

A restricting expression generator 10 generates restricting expressions of inequalities or equalities with respect to an arrival time or a required time at each node forming the network, corresponding to network information and false path information read from the storing portions 11 and 12. The restricting expression for each node is successively stored in a storing portion 13.

Figure 6:
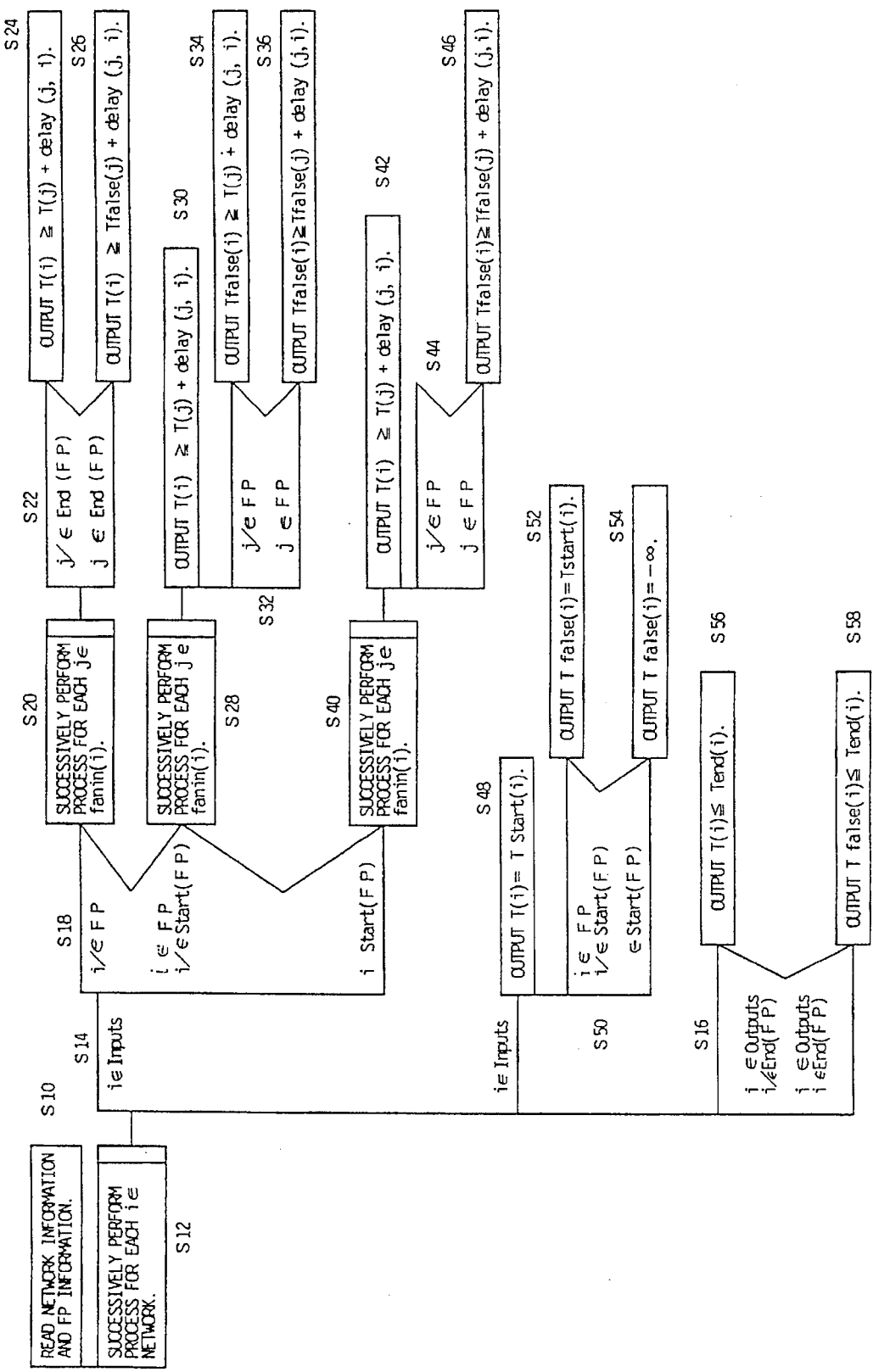
FIG. 6 is a flow chart showing a linear inequality generating process according to the present invention.
Figure 7:
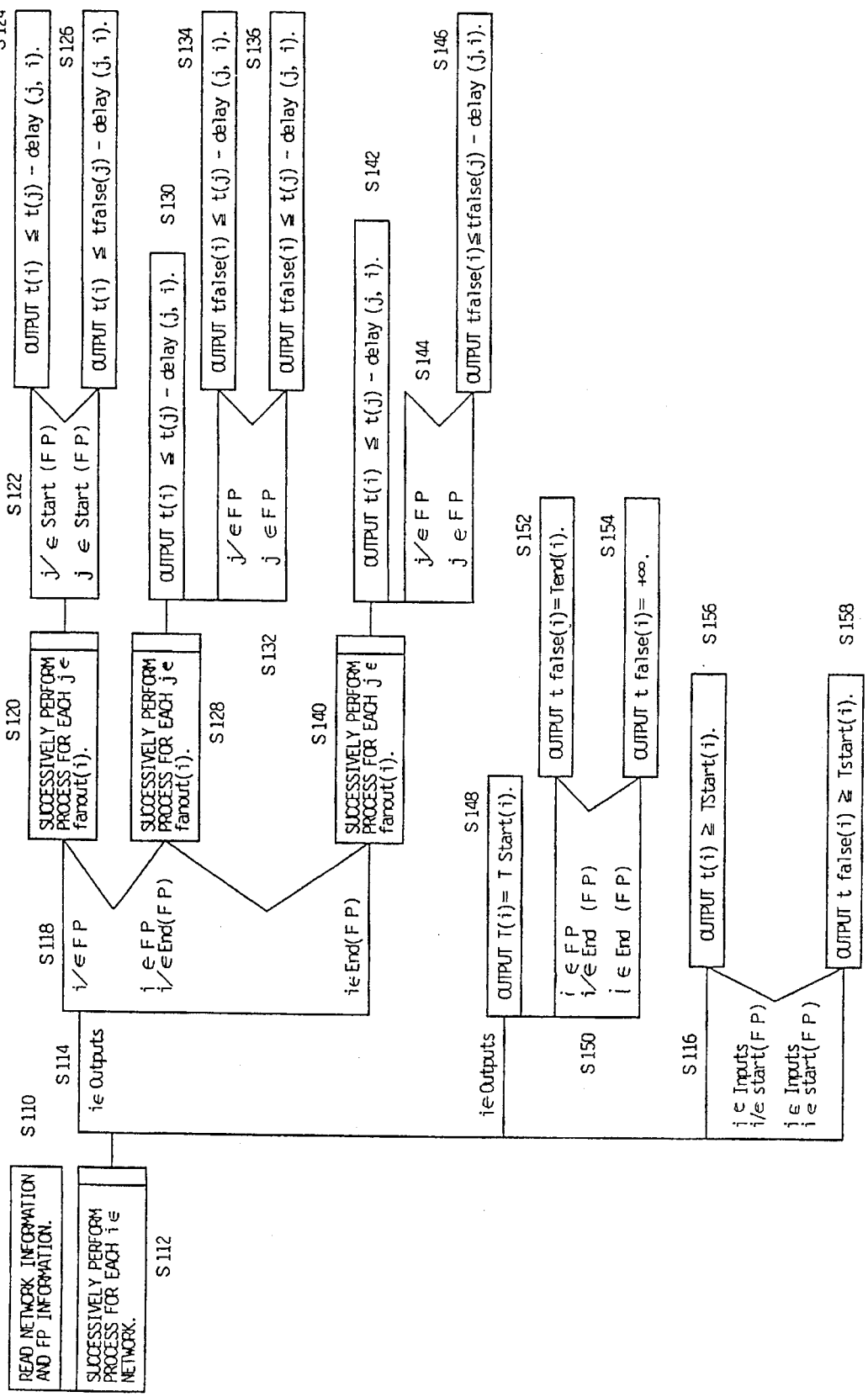
FIG. 7 is a flow chart showing a linear inequality generating process according to the present invention.

FIGS. 6 and 7 are flow charts of a linear inequality generating process (expressed by the formulas (3) and (4)) that performs a delay analysis and an optimization of a network.

In FIG. 6, the system reads network information and false path information at step S10. The system performs the following process for each node i in the network at step S12.

The system determines whether or not the node i is an input node of the false path FP at step S14. The system determines whether or not the node i is an output node of the network and an output node of the false path FP at step S16.

When the determined result at step S14 is i ∉ Inputs, the system determines whether the node i is included in the false path FP, whether the node i is included in the false path FP and is not an input node of the false path FP, or whether the node i is an input node of the false path FP.

When the determined result at step S18 is i ∉ FP, the system performs the following process for each node j that supplies an input to the node i at step S20. The system determines whether or not the node j is an output node of the false path FP at step S22. When the determined result at step S22 is j ∉ End (FP), the system outputs an inequality $T(i) \geq T(j) + \text{delay}(j, i)$, which corresponds to the first element of the right term of the formula (3) (a), at step S24. When the determined result at step S22 is j ∈ End(FP), the system outputs an inequality $T(i) \geq \text{Tfalse}(j) + \text{delay}(j, i)$, which corresponds to the second element of the right term of the formula (3) (a), at step S26.

When the determined result at step S18 is i ∈ FP and i ∉ Start(FP), the system performs the following process for each node j that supplies an input to the node i at step S28. The system outputs an inequality $T(i) \geq T(j) + \text{delay}(j, i)$, which corresponds to the first expression of the formula (3) (b), at step S30. The system determines whether or not the node j is included in the false path FP at step S32. When the determined result at step S32 is j ∉ FP, the system outputs an inequality $\text{Tfalse}(i) \geq T(j) + \text{delay}(j, i)$, which corresponds to the first element of the second expression of the formula (3) (b), at step S34. When the determined result at the step S32 is j ∈ FP, the system outputs an inequality Tfalse(i)

$\geq$Tfalse(j)+delay(j, i), which corresponds to the second element of the second expression of the formula (3) (b), at step S36.

When the determined result at step S18 is i $\in$ Start(FP), the system performs the following process for each node j that supplies an input to the node i at step S40. The system outputs an inequality T(i)$\geq$T(j)+delay(j, i), which corresponds to the first expression of the formula (3) (c), at step S42. The system determines whether or not the node j is included in the false path FP at step S44. When the determined result at the step S44 is j $\in$ FP, the system outputs an inequality Tfalse(i)$\geq$Tfalse(j)+delay(j, i), which corresponds to the second expression of the formula (3) (c), at step S46.

When the determined result at step S14 is i $\in$ Inputs, the system outputs an inequality T(i)=Tstart(i), which corresponds to the first expression of each of the formulas (3) (d), (3) (e), and (3) (f), at step S48. The system determines whether the node i is included in the false path FP and is not an input node of the false path FP, or whether the node is an input node of the false path FP at step S50. When the determined result at step S50 is i $\in$ FP and i /$\in$ Start(FP), the system outputs an equality Tfalse(i)=Tstart(i), which corresponds to the second expression of the formula (3) (e), at step S52. When the determined result at step S50 is i $\in$ Start(FP), the system outputs an equality Tfalse(i)=−∞, which corresponds to the second expression of the formula (3) (f), at step S54.

When the determined result at step S16 is i $\in$ Outputs and i /$\in$ End(FP), the system outputs an inequality T(i)$\geq$Tend(i), which corresponds to the formula (3) (g), at step S56. When the determined result at step 16 is i $\in$ Outputs and i $\in$ End(FP), the system outputs an inequality Tfalse(i)$\leq$Tend(i), which corresponds to the formula (3) (h), at step S58.

In FIG. 7, the system reads network information and false path FP information at step S110. The system performs the following process for each node i in the network at step S112.

The system determines whether or not the node i is an output node of the false path FP at step S114. The system determines whether or not the node i is an input node of the network and an input node of the false path FP at step S116.

When the determined result at step S114 is i /$\in$ Outputs, the system determines whether the node i is not included in the false path FP, whether the node i is included in the false path FP and is not an output node of the false path FP, or whether the node is an output node of the false path FP at step S118.

When the determined result at step 118 is i /$\in$ FP, the system performs the following process for each node j that receives an output of the node i at step S120. The system determines whether or not the node j is an input node of the false path FP at step S122. When the determined result at step S122 is j /$\in$ Start(FP), the system outputs an inequality t(i)$\leq$t(j)−delay(j, i), which corresponds to the first element of the right term of the formula (4) (a), at step S124. When the determined result at step S122 is j $\in$ Start(FP), the system outputs an inequality t(i)$\leq$tfalse(j)−delay(j, i), which corresponds to the second element of the right term of the formula (4) (a) at step S126.

When the determined result at step S118 is i $\in$ FP and i /$\in$ End(FP), the system performs the following process for each node j that receives an output of the node j at step S128. The system outputs an inequality t(i)$\leq$t(j)−delay(j, i), which corresponds to the first expression of the formula (4) (b), at step S130. The system determines whether or not the node j is included in the false path FP at step S132. When the determined result at step S132 is j /$\in$ FP, the system outputs an inequality tfalse(i)$\geq$t(j)−delay(j, i), which corresponds to the first element of the second expression of the formula (4) (b), at step S134. When the determined result at step 132 is j $\in$ FP, the system outputs an inequality tfalse(i)$\leq$tfalse(j)−delay(j, i), which corresponds to the second element of the second expression of the formula (4) (b), at step S136.

When the determined result at step S118 is i $\in$ End(FP), the system performs the following process for each node j that receives an output of the node j at step S140. The system outputs an inequality t(i)$\geq$t(j)−delay(j, i), which corresponds to the first expression of the formula (4) (c), at step S142. The system determines whether or not the node j is included in the false path FP at step S144. When the determined result at step S144 is j $\in$ FP, the system outputs an inequality tfalse(i)$\geq$tfalse(j)−delay(j, i), which corresponds to the second expression of the formula (4) (c) at step S146.

When the determined result at step S114 is i $\in$ Outputs, the system outputs an equality t(i)=Tend(i), which corresponds to the first expression of each of the formulas (4) (d), (4) (e), and (4) (f), at step S148. The system determines whether the node i is included in the false path FP and not an output node of the false path FP or whether the node i is an output node of the false path FP at step S150. When the determined result at step S150 is i $\in$ FP and i /$\in$ End(FP), the system outputs an equality tfalse(i)=Tend(i), which corresponds to the second expression of the formula (4) (e), at step S152. When the determined result at step S150 is i $\in$ End(FP), the system outputs an equality tfalse(i)=+∞, which corresponds to the second expression of the formula (4) (f), at step S154.

When the determined result at step S116 is i $\in$ Inputs and i /$\in$ Start(FP), the system outputs an inequality t(i)$\leq$Tstart(i), which corresponds to the formula (4) (g), at step S156. When the determined result at step S116 is i $\in$ Inputs and i $\in$ Start(FP), the system outputs an inequality tfalse(i)$\leq$Tstart(i), which corresponds to the formula (4) (h), at step S158.

Figure 8:
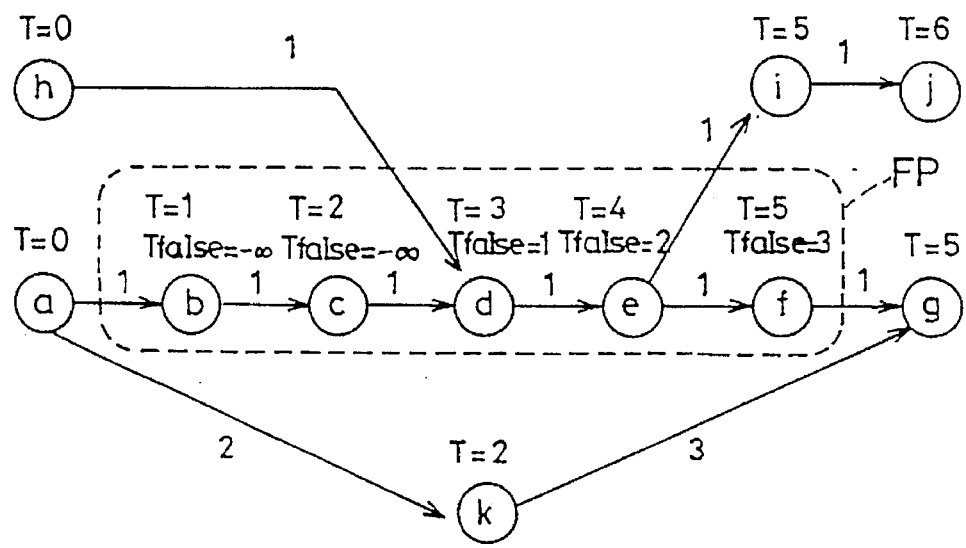
FIG. 8 is a schematic diagram showing a network having a false path FP.

FIG. 8 shows a construction of an embodiment of a network having a false path FP. In this drawing, a false path FP includes nodes b, c, d, e, and f. Start(FP) is b. End(FP) is f. An edge delay time between each node is 1 except that an edge delay time between nodes a and k is 2 and an edge delay time between nodes k and g is 3. Now assume that a time T at input nodes a and h is 0 and an allowable maximal arrival time at output nodes g and j is +∞. By applying the formula (3), an elapsed time between nodes a and g is 5, whereas an elapsed time between nodes h and g is 4. Thus, the following relations can be obtained. T(g)=max(5, 4)=5. Likewise, T(j)=max(6, 4)=6. An arrival time at each node is shown in FIG. 8.

A restricting expression of an arrival time at each node is given as follows. By employing the formula (3), each max operation is performed for an inequality and all expressions with ∞ are removed.

$T(a)=0$ $T(b) \geq T(a)+1$ $T(c) \geq T(b)+1$ $T(d) \geq T(c)+1, T(d) \geq T(h)+1, \text{Tfalse}(d) \geq T(h)+1$ $T(e) \geq T(d)+1, \text{Tfalse}(e) \geq \text{Tfalse}(d)+1$ $T(f) \geq T(e)+1, \text{Tfalse}(f) \geq \text{Tfalse}(e)+1$ $T(g) \geq \text{Tfalse}(f)+1, T(g) \geq T(k)+3$ $T(h)=0$ $$T(i) \geq T(e)+1$$

$$T(j) \geq T(i)+1$$

$$T(k) \geq T(a)+2$$

Thus, when the delay analyzing method according to the present invention is handles as a linear or non-linear programming problem, by simplifying expressions containing ∞, the number of variables and the number of restricting expressions can be reduced.

Figure 9:
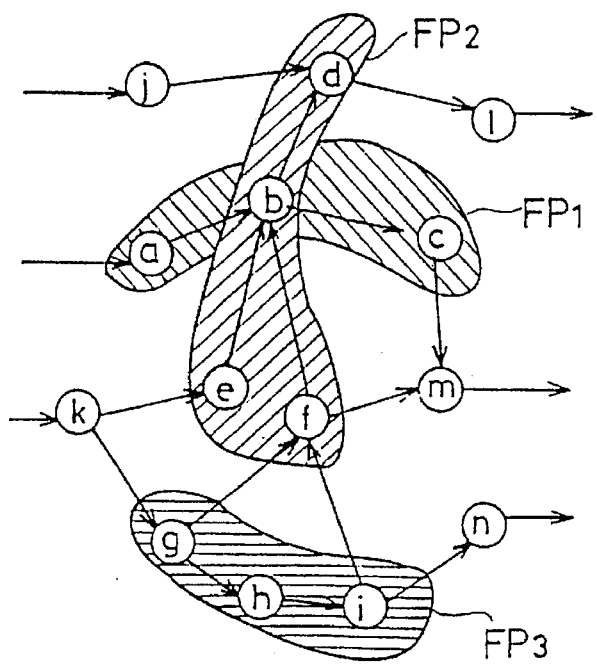
FIG. 9 is a schematic diagram showing network having false paths FPs.

As shown in FIG. 9, there may be a case where false paths FP (FP1={a, b, c}, FP2={b, d, e, f}, and FP3={g, h, i}) are present and the node b is included in FP1 and FP2. In this case, the node b should have three types of arrival time T, Tfalse(FP1), and Tfalse(FP2).

In other words, in the case that a node is included in n false path FPs, when the node has one t and n Tfalse's (namely a total of (n+1) arrival time variables), the relation of arrival time considering all false paths can be represented. Likewise, in analyzing a required time, when a node included in n false paths has one t and n tfalse's, which are required time variables, the relation of required time considering all false paths can be represented.

Figure 10:
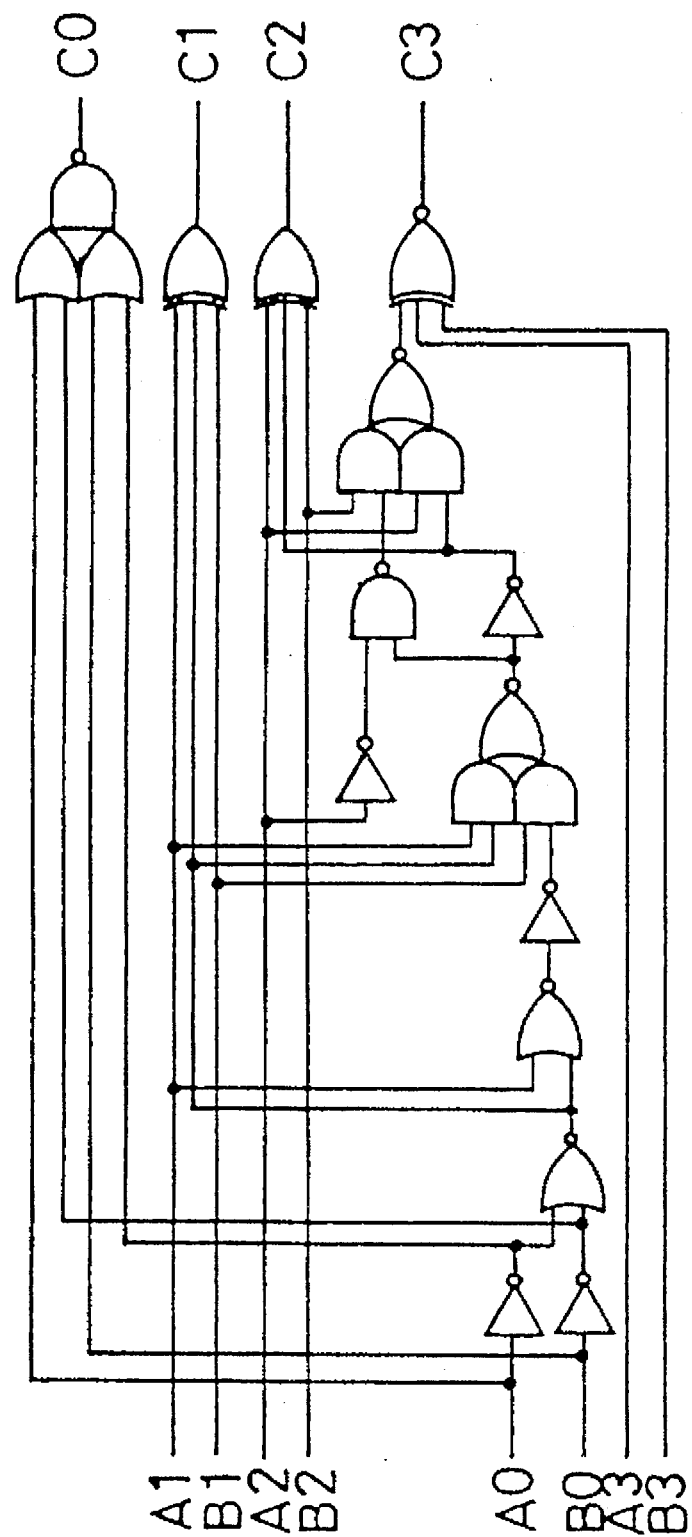
FIG. 10 is a schematic diagram for explaining an application of the present invention.

Next, applications of the present invention will be described. As shown in FIG. 10, each combinational circuit (i.e. excluding a sequential elements) is treated as a node. By connecting each node with lines, a network can be formed.

The combinational circuit can be analyzed according to the present invention.

Figure 11:
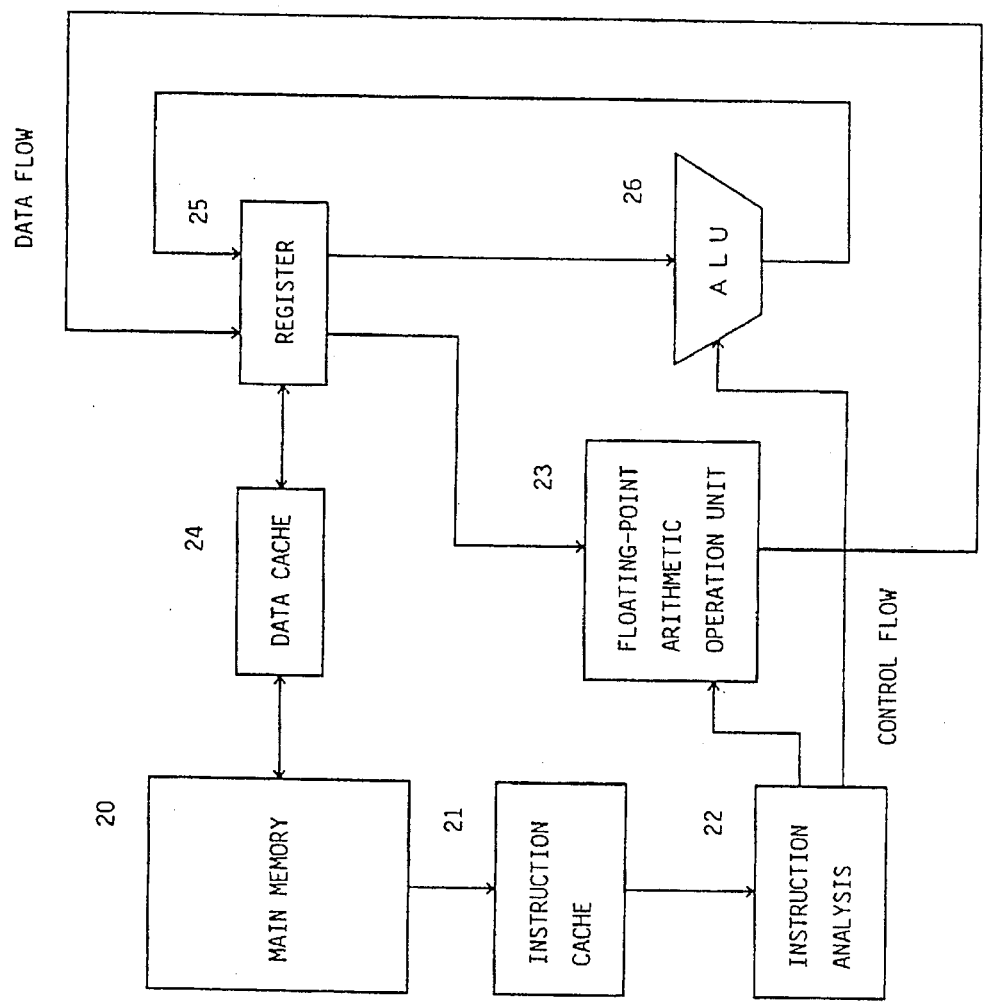
FIG. 11 is a block diagram for explaining an application of the present invention.

As shown in FIG. 11, in the internal circuitry of a computer, the functional blocks 20 to 26 can be treated as nodes. By connecting the nodes with lines, a network can be formed. The internal circuitry of the computer can be analyzed according to the present invention.

Figure 12:
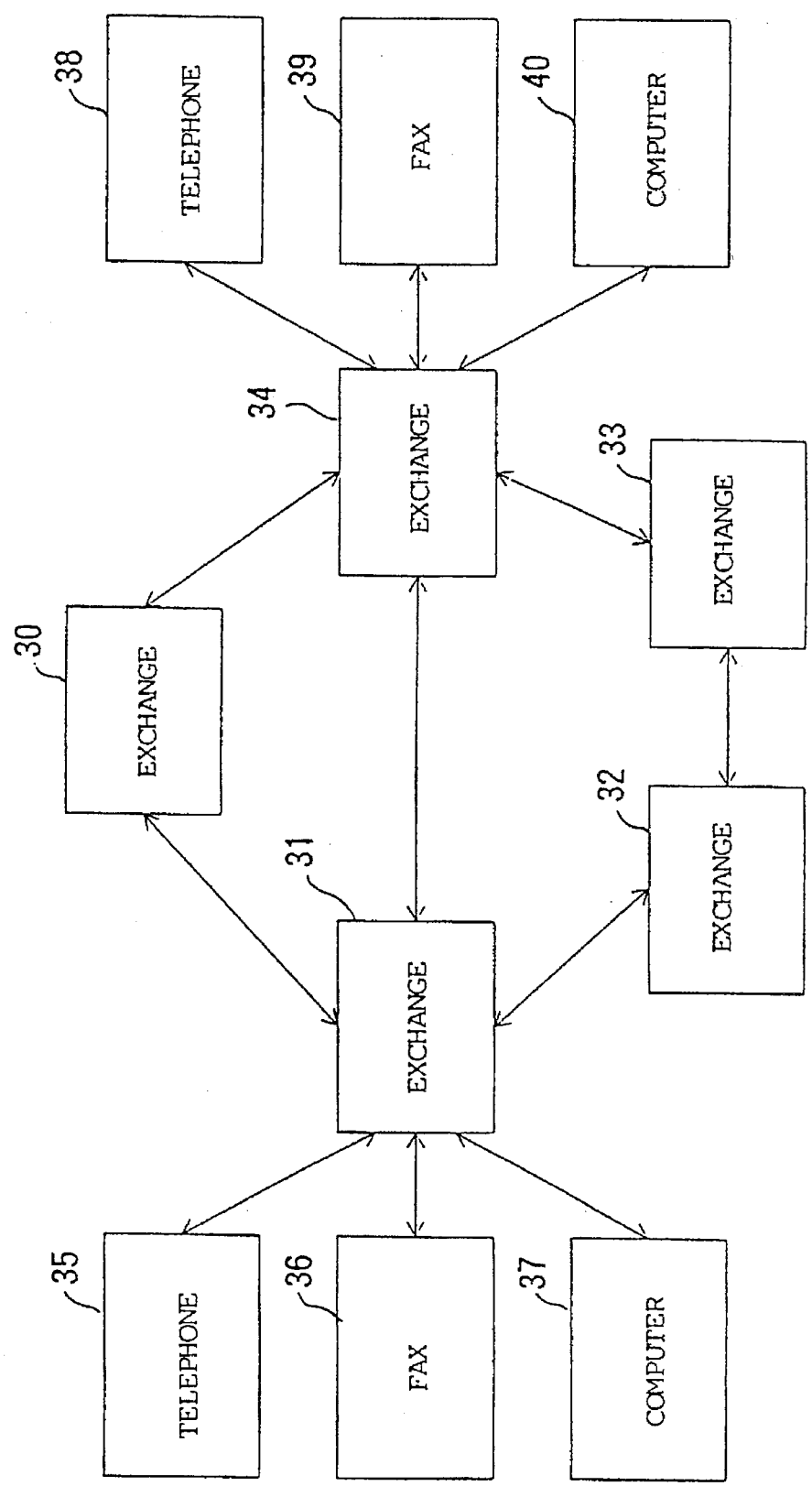
FIG. 12 is a block diagram for explaining an application of the present invention.

As shown in FIG. 12, in a communication system, exchanges 30 to 34 and terminal units 35 to 40 can be treated as nodes. By connecting the nodes with lines, a network can be formed. The communication system can be analyzed according to the present invention.

Figure 13:
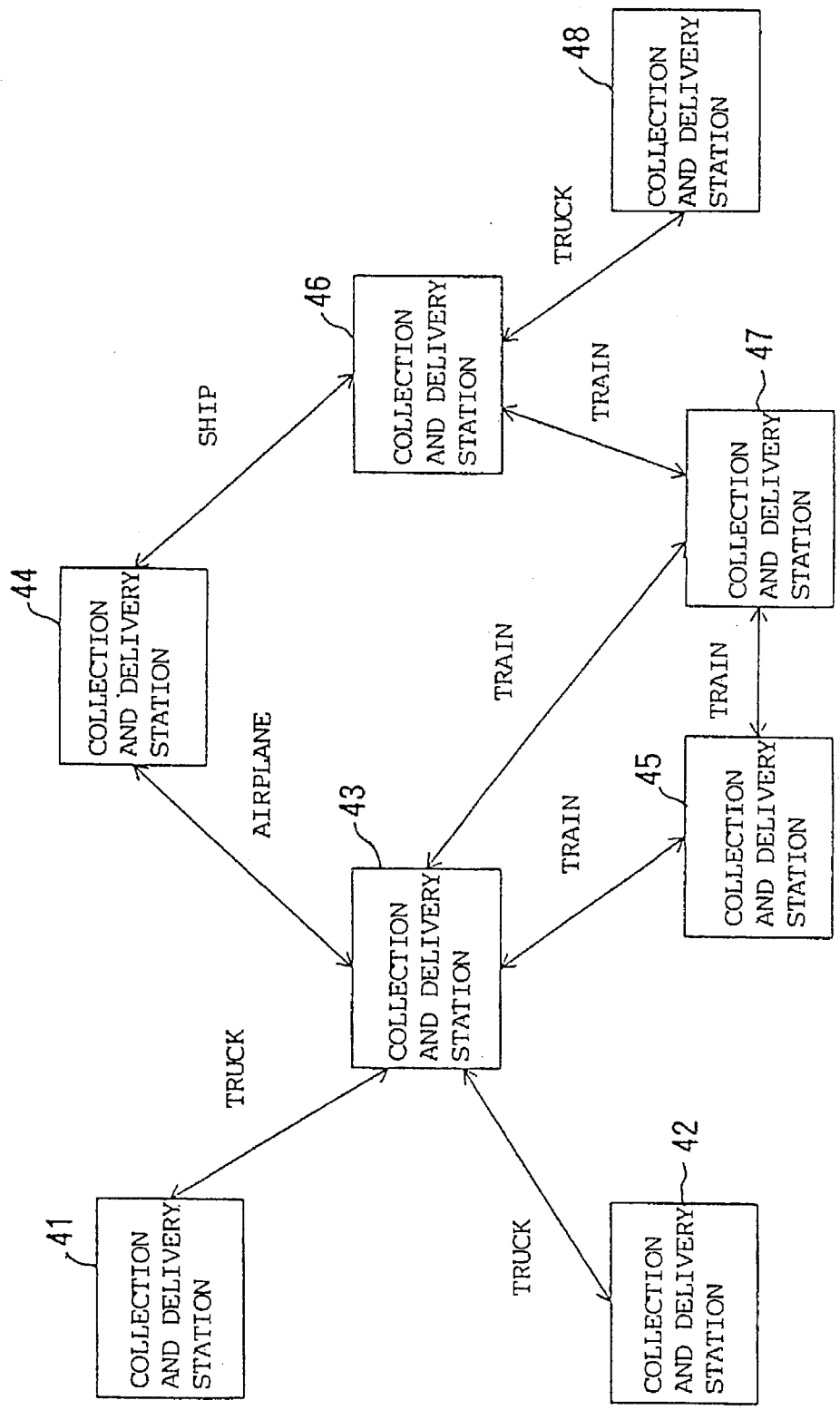
FIG. 13 is a block diagram for explaining an application of the present invention.

As shown in FIG. 13, in a physical distributing system, collection and delivery stations are nodes. By connecting the nodes with traffic systems such as trucks, trains, ships, and so forth, a network can be formed. Thus, the physical distribution system can be analyzed according to the present invention.

As described above, according to the network analyzing system of the present invention, delays of all paths in a network having false paths can be correctly evaluated so as to effectively analyze the network.

The present invention is not limited to the specifically disclosed embodiments, and variations and modifications may be made without departing from the scope of the present invention.

What is claimed is:

1. A computer-implemented network analyzing method for optimizing the structure of a network having nodes and a false path, the method comprising the steps of:

providing, for each node in the network related to the false path, a corresponding plurality of arrival time variables;

determining an arrival time for each node in the network, wherein, for each node in the network related to the false path, the determined arrival time includes a first arrival time with respect to the false path and a second arrival time without respect to the false path, the first arrival time and the second arrival time for a respective node being determined based on the corresponding plurality of arrival time variables; and performing a delay analysis of the network by analyzing the determined arrival times, to optimize the structure of the network.

2. The computer-implemented network analyzing method as claimed in claim 1, wherein the network has a plurality of false paths and the step of determining an arrival time comprises:

determining, for each false path, an arrival time with respect to each node included in the respective false path.

3. The computer-implemented network analyzing method as claimed in claim 1, further comprising the step of:

obtaining a linear equation having a restricting expression representing an arrival time variable of each node of the network, wherein the step of performing a delay analysis performs a delay analysis according to a linear programming technique using the obtained linear equation.

4. The computer-implemented network analyzing method as claimed in claim 1, wherein the step of determining an arrival time comprises:

scanning each of the nodes in the network from an input side of the network to an output side of the network to determine an arrival time of each node.

5. A computer-implemented network analyzing method for optimizing the structure of a network having nodes and a false path, the method comprising the steps of:

providing, for each node in the network related to the false path, a corresponding plurality of required time variables;

determining a required time for each node in the network, wherein, for each node in the network related to the false path, the determined required time includes a first required time with respect to the false path and a second required time without respect to the false path, the first required time and the second required time for a respective node being determined based on the corresponding plurality of required time variables; and performing a delay analysis of the network by analyzing the determined required times, to optimize the structure of the network.

6. The computer-implemented network analyzing method as claimed in claim 5, wherein the network has a plurality of false paths and the step of determining a required time comprises:

determining, for each false path, a required time with respect to each node included in the respective false path.

7. The computer-implemented network analyzing method as claimed in claim 5, further comprising the step of:

obtaining a linear equation having a restricting expression representing a required time variable of each node of the network, wherein the step of performing a delay analysis performs a delay analysis according to a linear programming technique using the obtained linear equation.

8. The computer-implemented network analyzing method as claimed in claim 5, wherein the step of determining a required time comprises:

scanning each of the nodes in the network from an input side of the network to an output side of the network to determine a required time of each node.

* * * * *